United States Patent [19]

Guillet

[11] Patent Number: 4,594,309
[45] Date of Patent: Jun. 10, 1986

[54] α,β DIKETONE CONTAINING POLYMERS AS POSITIVE PHOTORESIST COMPOSITIONS

[75] Inventor: James E. Guillet, Don Mills, Canada

[73] Assignee: Allied Corporation, Morris Township, N.J.

[21] Appl. No.: 666,864

[22] Filed: Oct. 31, 1984

[51] Int. Cl.$^4$ .............. G03C 1/495; G03C 5/16; C08F 16/36; C08F 12/32
[52] U.S. Cl. .................. 430/270; 430/311; 526/293; 526/316; 526/284; 526/299; 526/291
[58] Field of Search ............ 526/293, 316, 284, 299, 526/291; 430/270, 311

[56] References Cited

U.S. PATENT DOCUMENTS

| | | | |
|---|---|---|---|
| 2,692,260 | 10/1954 | D'Alelio | 526/293 X |
| 3,853,814 | 10/1974 | Guillet | 526/316 |
| 4,243,742 | 1/1981 | Hersener et al. | 526/291 X |
| 4,297,433 | 10/1981 | Tsuda et al. | 430/270 |

FOREIGN PATENT DOCUMENTS

| | | | |
|---|---|---|---|
| 52-49286 | 4/1977 | Japan | 526/291 |
| 53-81114 | 7/1978 | Japan | 430/270 |

OTHER PUBLICATIONS

N. Ogata & K. Nakayama, Polymer Letters, 6, 369, (1968).
R. E. Lutz & R. J. Taylor, J. Am. Chem. Soc., 55, 1168, (1933).
R. E. Lutz, Org. Syn. Coll., vol. 3, 248, (1955).
J. B. Conant & R. E. Lutz, J. Am. Chem. Soc., 45, 1303, (1923).
Reimschneider & Claus, Monatsh. Chem. 93, 843 (1962).

*Primary Examiner*—John E. Kittle
*Assistant Examiner*—Cynthia Hamilton
*Attorney, Agent, or Firm*—Arthur J. Plantamura; Jay P. Friedenson; Patrick L. Henry

[57] ABSTRACT

Photoresist materials that are sensitive in suitable range including the 200 nm to 300 nm ultraviolet radiation range are provided which permit relatively higher resolution and thus a higher information density in microcircuits. The positive photoresist materials are copolymers of (a) monomers selected from those of 1,4-disubstituted-2-butene-1,4-diones of the general structures of

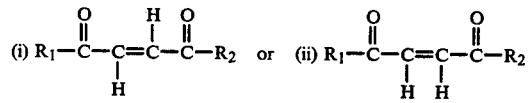

wherein $R_1$, $R_2$ are the same or different and are substituent selected from the group of 1 to 6 carbon atom alkyl and halogen substitutes alkyl radicals methoxy and ethoxy radicals, aryl, halogen substituted aryl, alkyl substituted aryl, alkoxy substituted aryl, nitro substituted aryl, cyano substituted aryl and amino substituted aryl radicals, and benzyl, naphthyl and anthryl radicals with (b) at least one vinylidene monomer of the general formula

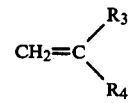

where $R_3$ represents hydrogen, halogen or an alkyl group, and $R_4$ is a functional group such as aryl, substituted aryl, carboxylic acid, lower alkyl carboxylate, lower alkyl, lower alkenyl, hydrogen, halogen, nitrile, lower acyloxy, lower alkoxy amido, or substituted amido, provided however where either $R_3$ or $R_4$ is hydrogen, the other is not a phenyl radical.

Typical comonomers are methyl methacrylate, acrylonitrile, acrylamide, α-methyl styrene, ethyl acetate, ethyl methacrylate, n-propylmethacrylate and N-benzyl methacrylamide.

19 Claims, No Drawings

α,β DIKETONE CONTAINING POLYMERS AS POSITIVE PHOTORESIST COMPOSITIONS

BACKGROUND OF THE INVENTION

1. Field of the Invention

This invention relates to novel positive photoresist compositions and to the method for providing positive photoresist layers. In particular the invention deals with α, β diketone-containing polymers as radiation sensitive positive photoresist compositions that have advantageous properties when applied on various substrates. The compositions of the invention are particularly useful in that they provide relatively superior resolution, good adhesion to substrates and good etch resistance.

2. Description of the Prior Art

Photoresists are materials which change their solubility in response to a developer solution after the photoresist has been exposed, such as to ultraviolet radiation. Photoresist compositions may comprise a photo-sensitive compound (hereafter sometimes called sensitizer or photosensitizer), which is blended with a film forming polymeric resin and a solvent. Photoresist compositions may comprise also polymeric materials which of themselves are inherently light sensitive. It is with the latter type, specifically a copolymeric material, that the present invention is concerned. As a consequence of the exposure to radiation of the photoresist, a different solubility rate results between the exposed and unexposed (masked over) portions of a resist film that yields a surface relief pattern after the development. Those photoresists which become more soluble in the exposed regions are referred to as positive photoresists.

The photoresists are applied in any suitable manner, such as by spin coating from an organic solvent or solvent mixture, onto a substrate, such as silicon wafers and chrome plated glass plates. A developer removes the areas of the coated photoresist film that has been exposed to light or other form of irradiation so as to produce a pattern in the photoresist film.

The application of a photosensitive film to various substrates is an essential step in the fabrication of integrated circuits. The substrates are generally silicon wafers which may have a thin oxide coating or other coating such as a silicon nitride or aluminum. The photosensitive film is used to pattern the substrate in a series of steps including exposure, development and substrate etch. It is essential that the mask pattern be accurately reproduced in the substrate etch pattern. To achieve this high degree of accuracy, it is essential that the photoresist film be of uniform thickness, have good adhesion to substrates, good contrast in images formed, and good etch resistance properties.

One of the limitations of materials currently used as commercial photoresists is their lack of sensitivity to light at wavelengths much below 300 nm. The resolution attainable with these resists is typically in the 2–4μ range and would be improved were they sensitive to shorter wavelengths of light. There is, therefore, a need for photoresist materials that are sensitive in the deep UV (200–300 nm), i.e. for materials permitting higher resolution and thus a higher information density in the microcircuits manufactured using them. This sensitivity in the deep UV must be accompanied by the other normal attributes of a resist material including good adhesion to substrates, good contrast in images formed, and good etch resistance properties.

SUMMARY OF THE INVENTION

In accordance with the invention, I have discovered a new class of polymeric positive photoresists consisting of copolymers of (a) the monomers of 1,4-disubstituted-2-butene-1,4-diones of the general structure:

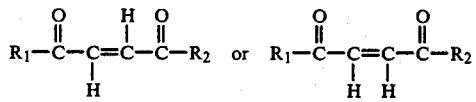

Wherein $R_1$ and $R_2$ are the same or different and are substituent selected from the group consisting of 1 to 6 carbon atom alkyl and halogen substitute alkyl radicals; methoxy and ethoxy radicals; aryl, halogen substituted aryl, alkyl substituted aryl, alkoxy substituted aryl, nitro substituted aryl, cyano substituted aryl and amino substituted aryl radicals, and benzyl, naplothyl and anthryl radicals with (b) At least one vinylidene monomer of general formula

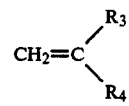

where $R_3$ represents hydrogen, halogen or an alkyl group, and $R_4$ is a functional group such as aryl, substituted aryl, carboxylic acid, lower alkyl carboxylate, lower alkyl, lower alkenyl, hydrogen, halogen, nitrile, lower acyloxy, lower alkoxy, amido substituted amido, provided however when $R_3$ or $R_4$ is hydrogen the other is not a phenyl radical. The relative proportions are chosen so as to produce a solid copolymer containing from about 0.1 to about 50 weight percent of said α, β diketone monomer.

Examples of suitable vinylidene monomers include methyl acrylate, methyl methacrylate, vinyl acetate, methacrylonitrile, acrylonitrile, vinyl chloride, acrylic acid, methacrylic acid, chlorostyrene, α-methylstyrene, vinyl toluene, butadiene, isoprene and the like.

These copolymer compositions when formulated into positive photoresist compositions, applied as thin films to substrates and exposed to ultraviolet light in the 200–300 nm range undergo chain degradation, permitting high resolution and a high information density in microcircuit manufacture.

DESCRIPTION OF THE PREFERRED EMBODIMENT

The photoresist compositions of the invention which comprise a novel class of ketone-containing copolymers, are characterized by the presence of α, β diketone groups. When exposed to ultraviolet light under advantageous conditions of use, thin films of these polymers undergo chain degradation making these materials positive photoresists. Comparatively, these materials overcome the limitations of materials which lack sensitivity to light at wavelengths below about 300 nm. The resolution attainable with prior art resists is typically in the 2–4μ range and would be improved were they sensitive to shorter wavelengths of light. The photoresist materials of the present invention are sensitive in the deep UV (200–300 nm), thereby permitting higher resolution and thus a higher information density in the microcircuits manufactured using them. This sensitivity in the deep UV of the photoresist materials of the present invention is accompanied by the other normal attributes of a desirable resist material: good adhesion to substrates, good contrast in images formed, and good etch resistance properties.

The new class of polymeric positive photoresists in accordance with the invention consists of copolymers of:

(a) the monomers 1,4-disubstituted-2-butene-1,4-diones of the general structure:

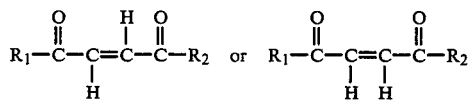

wherein $R_1$ and $R_2$ are the same or different and are substituent selected from the group of 1 to 6 carbon atom alkyl and halagen substituted alkyl radicals, methoxy and ethoxy radicals; aryl and halogen substituted aryl, alkyl substituted aryl, alkoxy substituted aryl, nitro substituted aryl, cyano substituted aryl and amino substituted aryl radicals, and benzyl, naphthyl and anthryl radicals with (b) At least one vinylidene comonomer of general formula

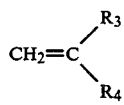

where $R_3$ represents hydrogen, halogen or an alkyl group, and $R_4$ is a functional group such as aryl, substituted aryl, carboxylic acid, lower alkyl carboxylate, lower alkyl, lower alkenyl, hydrogen, halogen, nitrile, lower acyloxy, lower alkoxy, amido, or substituted amido, provided, however, when either $R_3$ or $R_4$ is hydrogen, the other is not a phenyl radical the relative proportions being chosen so as to produce a solid copolymer containing from about 0.1 to about 50 weight percent of said $\alpha, \beta$ diketone monomer.

Examples of suitable vinylidene monomers include methyl acrylate, methyl methacrylate, vinyl acetate, methacrylonitrile, acrylonitrile, vinyl chloride, acrylic acid, methacrylic acid, chlorostyrene, $\alpha$-methylstyrene, vinyl toluene, butadiene, isoprene and the like. Preferred practical polymer compositions within the contemplated invention include: methyl methacrylate, acrylonitrile and N-benzyl methacrylamide (b) with the comonomers of (a).

The specific compounds of the disclosure, of which copolymers of trans-1,4-diphenyl-2-butene-1,4-dione with methyl methacrylate (DPBD/MMA) are typical, are sensitive to light in the 250-300 nm region, thereby fulfilling the primary need described above.

The monomers employed are commercially available or may be prepared by methods known in the art. For example, the comonomer:

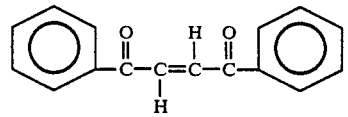

is avilable commercially from Pfalz and Bauer, Inc. (Stamford, Conn.) and may be copolymerized with methyl methacrylate (MMA) in a bulk polymerization at 75° C. using azobisisobutyronitrile (AIBN) catalyst to yield polymers in the $10^4$–$10^5$ molecular weight range. The UV absorbance spectrum of these polymers shows strong absorbance in the 225-300 nm region, with a weak tail in the 300-325 nm region.

Thin films (3$\mu$) of these DPBD/MMA copolymers were cast on glass plates and exposed to UV radiation (OAI 500 W mercury-xenon light source, no filter), for a 60 sec. exposure and redissolved in solvent. The molecular weight of these polymers is significantly decreased relative to that of the unexposed material. A thin film spun onto a silicon wafer gave a developable image after a 60 sec. exposure (exposure conditions as above). Solvents commonly used in developing methacrylate-based resists appear to work satisfactorily for these polymers.

Based on these observations, this material has potential use as a positive deep UV resist. It can be spun, exposed and developed using commercial practices. The lack of significant absorbance of light above 300 nm would permit the attainment of higher resolution than with those resists working at longer wavelengths.

In a similar manner other copolymers of DPBD with acrylonitrile and N-benzyl methacrylamide may be prepared. Similarly the monomer cis-1,4-dimethyl-2-butene-1,4-dione (DMBD) has been synthesized following procedures described in the literature, see R. Reimschneider et al. Monatsh. Chem., 93, 843 (1962). This material was copolymerized with methyl methacrylate, styrene, acrylonitrile and N-benzyl methacrylamide yielding photosensitive materials that show degradation of these materials upon UV exposure.

The invention will be further described by the following specific examples. It will be understood, however, that although these examples may describe in detail certain preferred operating conditions of the invention, they are given primarily for purposes of illustration and the invention in its broader aspects is not limited thereto.

EXAMPLE 1

The monomeric compounds trans-1,4-diphenyl-2-butene-1,4-dione (DPBD) as purchased, cis-1,4-Dimethyl-2-butene-1,4-dione (DMBD) as synthesized according to the method described by Reimschneider and Claus, Monatsh. Chem. 93 843 (1962), were employed in this example.

Bulk copolymerizations of each of the diketones with a $\alpha$-methyl styrene and methyl methacrylate were conducted. The procedure was the same in all cases: the diketone and comonomer were placed in a 6-mm diameter tube, 0.2% AIBN initiator added and the tube $N_2$ flushed/vacuum pumped five times before being sealed under vacuum. After 24 hours at 75° C. the tubes were broken open and the "glassy" polymer dissolved in toluene; dropwise addition of this solution to hexane gave a precipitate that was filtered and vacuum dried. Further details are provided below in Table I.

TABLE I

| Polymer | Monomers M$_1$ | M$_2$ | Initiator | Temp °C. | Time hr | Yield % | $[\eta]$* dl/g |
|---|---|---|---|---|---|---|---|
| P1 | DMBD(10) | αMeSTY(90) | AIBN | 75 | 24 | trace | — |
| P2 | DPBD(10) | αMeSTY(90) | AIBN | 75 | 24 | trace | — |
| P3 | DMBD(10) | MMA(90) | AIBN | 75 | 24 | 68 | 0.83 |
| P4 | DPBD(10) | MMA(90) | AIBN | 75 | 24 | 59 | 0.84 |
| P5 | DPBD(33) | MMA(67) | AIBN | 75 | 24 | 20 | 0.41 |

*$[\eta]$ intrinsic viscosity measurement related to molecular weight.

Each of the DMBD and DPBD copolymers showed a decrease in molecular weight upon UV exposure in methylene chloride solution, with the methacrylate compounds having the highest sensitivity. The quantum efficiency for chain scission, $\phi_s$ can be related to the change in molecular weight by the proportionate expression:

$$\phi_s \alpha \frac{[\text{poly}]}{I_{abs}} \left[ \frac{M_\nu(O)}{M_\nu(t)} - 1 \right] \quad (1)$$

where $\alpha$ is the proportionality symbol, [poly] is the molar polymer concentration in the test solution, $I_{abs}$ the number of photons absorbed and $M_0(O)/M_\nu(t)$ the ratio of molecular weights determined from intrinsic viscosity measurements before and after exposure for a time t. Because a broad band UV excitation is used, $I_{abs}$ is not easily defined. An empirical analogue to $\phi_s$ is used instead. This is referred to as the relative scission efficiency, Sc:

$$\frac{Sc_1}{Sc_2} = \frac{[\text{poly}]_1}{[\text{poly}]_2} \frac{\{[M_\nu(O)/M_\nu(t)] - 1\}_1}{\{[M_\nu(O)/M_\nu(t)] - 1\}_2} \quad (2)$$

Using phenyl vinyl ketone/MMA as a reference, the results in Table II are obtained.

The DPBD/MMA system shows good sensitivity, especially copolymers containing higher proportions of the $\alpha, \beta$ diketone monomer.

TABLE II

| Polymer | $[\eta]_0$ | $\overline{M}_\nu(O)^a$ | 260 nm$^b$ A$_{1\mu}$ | Sc | %$^c$ ketone |
|---|---|---|---|---|---|
| DPBD/MMA 2/98 | 0.839 | 2.01 × 10$^5$ | 0.22 | 0.56 | 2 |
| DPBD/MMA 5/95 | 0.405 | 8.09 × 10$^4$ | 0.35 | 1.22 | 5 |
| DMBD/MMA$^d$ | 0.827 | 1.97 × 10$^5$ | 0.13 | 0.36 | — |
| PVK/MMA 15/85 | 0.283 | 5.16 × 10$^4$ | 0.37 | 1.00 | 15 |

$^a$Molecular weights are calculated from $[\eta]$ using literature values for the Mark-Houwink coefficient for the major constituent in CH$_2$Cl$_2$.
$^b$The absorbance at 260 nm of a 1μ film is calculated based on the measured solution absorbance values.
$^c$% ketone is the actual amount of ketone in the polymer, calculated (where possible) from the UV absorbance spectra.
$^d$The mole fraction of DMBD detected was not measured.

EXAMPLE II

Solid State Sensitivity

The copolymers of trans-1,4-diphenyl-2-butene-1,4-dione (DPBD) with methyl methacrylate (MMA) prepared as described above were tested for solid state sensitivity. A control MMA sample was also tested, as well as a copolymer of MMA with phenyl vinyl ketone (PVK). All samples were exposed to the full output of an OAI model 30 deep UV light source for 60 sec. Results are presented in Table III along with those for MIPK derived from a comparable measurement.

TABLE III

| Polymer | $[\eta]_0$ in CH$_2$Cl$_2$ | $\frac{[\eta]_0}{[\eta]_t}$ | $\overline{M}_0$ | $\frac{\overline{M}_0}{\overline{M}_t} - 1$ | $S_{rel}$ | $A^{1\mu}_{260}$ |
|---|---|---|---|---|---|---|
| MIPK | 1.85 | | 7.5 × 10$^5$ | 4.16 | 1.00 | 0.07 |
| MMA | 0.40 | 1.02 | 7.9 × 10$^4$ | 0.02 | 0.04 | 0.08 |
| MMA/PVK 85:15 | 0.32 | 1.40 | 6.0 × 10$^4$ | 0.52 | 1.56 | 0.37 |
| MMA/DPBD 98:2 | 0.44 | 2.56 | 8.9 × 10$^4$ | 2.24 | 4.5 | 0.24 |
| MMA/DPBD 95:5 | 0.20 (toluene) | 2.39 | 5.3 × 10$^4$ | 2.30 | 7.8 | 0.36 |

The molecular weight values, $\overline{M}_0$, were determined using the relationship $[\eta] = KM^a$. For methacrylate polymers, the literature values for CHCl$_3$ solutions (K=4.8×10$^{-5}$dl/g, a=0.80) or for toluene solutions (K=7.1×10$^{-5}$dl/g, a=0.73) were used. For MIPK, values of K=10×10$^{-5}$dl/g, a=0.70 were applied. Values for $\overline{M}_0/\overline{M}_t - 1$ are derived using the relationship $$\frac{\overline{M}_o}{\overline{M}_t} = \frac{[\eta]_o}{[\eta]_t} \cdot \frac{1}{a}.$$

This entry in the table represents the number of chain breaks per molecule for the given exposure conditions. Dividing this value by $\overline{M}_0$ gives the number of chain breaks per gram presented in the table normalized with respect to the MIPK result. The $A_{260}{}^{1\mu}$ values show the expected absorbance at 260 nm of a 1μ film, based on the measured solution absorbance spectra. The results for the MMA/DPBD polymers show a relative sensitivity ($S_{rel}$) significantly higher than that for MIPK.

The invention contemplates, in addition to the novel copolymer compositions and novel photoresist compositions, an intermediate article of manufacture comprising a microcircuit element substrate having applied thereon the said polymeric photoresist composition.

It will be apparent that various modifications may be made by one skilled in the art within the scope of, and without departing from the spirit of, the present invention.

What is claimed is:

1. A composition of matter consisting essentially of a copolymeric material of:
   (a) from about 0.1 to about 50 weight percent of a monomer selected from the group consisting of 1,4-disubstituted-2-butene-1,4-diones of the general structure

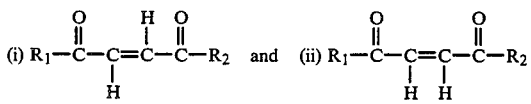 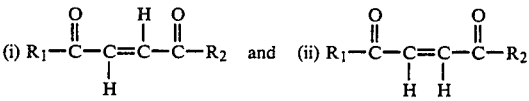

and mixtures of (i) and (ii) where $R_1$, $R_2$ are the same or different and are substituent selected from the group of 1 to 6 carbon atom allyl and halogen substitute alkyl radicals, aryl, halogen substituted aryl, alkyl substituted aryl, alkoxy substituted aryl, nitro substituted aryl, cyano substituted aryl and amino substituted aryl radicals, and benzyl, naphthyl and anthryl radicals with (b) at least one vinylidene monomer of general formula

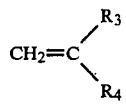

where $R_3$ represents hydrogen, halogen or an alkyl group, and $R_4$ is a functional group selected from the group consisting of aryl, substituted aryl, carboxylic acid, lower alkyl carboxylate, lower alkyl, lower alkenyl, hydrogen, halogen, nitrile, lower acyloxy, lower alkoxy, amido and substituted amido provided, however, where either $R_3$ or $R_4$ is hydrogen, the other is not a phenyl radical.

2. The composition of claim 1 wherein (a) is trans-1,4-diphenyl-2-butene-1,4-dione.

3. The composition of claim 1 wherein (a) is cis-1,4-dimethyl-2-butene-1,4-dione.

4. The composition of claim 1 wherein the comonomer (b) is methyl methacrylate.

5. The composition of claim 2 wherein the comonomer (b) is methyl methacrylate.

6. The composition of claim 1 wherein (b) is acrylonitrile.

7. The composition of claim 1 wherein (b) is N-benzyl methacrylamide.

8. The composition of claim 3 wherein the comonomer (b) is methyl methacrylate.

9. A positive photoresist solution comprising a photoresist copolymeric material which is sensitive to ultraviolet light range of:

(a) from about 0.1 to about 50 weight percent of a monomer selected from the group consisting of 1,4-disubstituted-2-butene-1,4-diones of the general structure and mixtures of (i) and (ii) where $R_1$, $R_2$ are the same or different and are substituent selected from the group of 1 to 6 carbon atom allyl and halogen substitute alkyl radicals, aryl, halogen substituted aryl, alkyl substituted aryl, alkoxy substituted aryl, nitro substituted aryl, cyano substituted aryl and amino substituted aryl radicals, and benzyl, naphthyl and anthryl radicals with (b) at least one vinylidene monomer of general formula

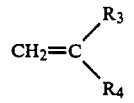

where $R_3$ represents hydrogen, halogen or an alkyl group, and $R_4$ is a functional group such as aryl, substituted aryl, carboxylic acid, lower alkyl carboxylate, lower alkyl, lower alkenyl, hydrogen, halogen, nitrile, lower acyloxy lower alkoxy, amido, or substituted amido provided, however, where either $R_3$ or $R_4$ is hydrogen, the other is not a phenyl radical and (c) an organic solvent capable of solubilizing said copolymeric material.

10. The photoresist composition of claim 9 wherein (a) is trans-1,4-diphenyl-2-butene-1,4-dione.

11. The photoresist composition of claim 9 wherein (a) is cis-1,4-dimethyl-2-butene-1,4-dione.

12. The photoresist composition of claim 9 wherein the comonomer (b) is methyl methacrylate.

13. The photoresist composition of claim 10 wherein the comonomer (b) is methyl methacrylate.

14. The photoresist composition of claim 9 wherein (b) is acrylonitrile.

15. The photoresist composition of claim 9 wherein (b) is acrylonitrile.

16. The photoresist composition of claim 9 wherein (b) is N-benzyl methacrylamide.

17. The photoresist composition of claim 11 wherein the comonomer (b) is methyl methacrylate.

18. The photoresist composition of claim 11 wherein the comonomer (b) is methyl methacrylate.

19. An intermediate article of manufacture comprising a micro circuit element substrate having applied thereon a homogeneous thin film of the composition of claim 9.

* * * * *

UNITED STATES PATENT AND TRADEMARK OFFICE
CERTIFICATE OF CORRECTION

PATENT NO. : 4,594,309
DATED : June 10, 1986
INVENTOR(S) : JAMES E. GUILLET

It is certified that error appears in the above-identified patent and that said Letters Patent are hereby corrected as shown below:

Col. 8, line 43 and 44 should be deleted

Col. 8, line 45 "16" should read -- 15 --

Col. 8, line 47 "17" should read -- 16 -- and after the word claim "11" should read -- 10 --

Col. 8, line 49 "18" should read -- 17 --

Col. 8, line 51 "19" should read -- 18 --

Signed and Sealed this

Seventh Day of October, 1986

[SEAL]

Attest:

DONALD J. QUIGG

Attesting Officer

Commissioner of Patents and Trademarks